(12) United States Patent
Aizawa et al.

(10) Patent No.: US 11,966,209 B2
(45) Date of Patent: Apr. 23, 2024

(54) SIMULATOR, NUMERICAL CONTROL DEVICE, AND SIMULATION METHOD

(71) Applicant: FANUC CORPORATION, Yamanashi (JP)

(72) Inventors: Nobuaki Aizawa, Yamanashi (JP); Wei Zhao, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 577 days.

(21) Appl. No.: 17/116,372

(22) Filed: Dec. 9, 2020

(65) Prior Publication Data
US 2021/0200179 A1 Jul. 1, 2021

(30) Foreign Application Priority Data
Dec. 26, 2019 (JP) .................................. 2019-236557

(51) Int. Cl.
*G05B 19/402* (2006.01)
*G06F 30/20* (2020.01)

(52) U.S. Cl.
CPC .......... *G05B 19/402* (2013.01); *G06F 30/20* (2020.01); *G05B 2219/32342* (2013.01); *G05B 2219/34013* (2013.01); *G05B 2219/50047* (2013.01)

(58) Field of Classification Search
CPC ........ G05B 19/402; G05B 2219/32342; G05B 2219/34013; G05B 2219/50047; G06F 30/20
See application file for complete search history.

(56) References Cited

U.S. PATENT DOCUMENTS

| 2015/0066191 | A1* | 3/2015 | Yasukochi | G05B 19/4069 700/160 |
| 2015/0151445 | A1* | 6/2015 | Masumiya | B23C 3/28 83/875 |
| 2016/0054724 | A1* | 2/2016 | Oda | G05B 19/4093 356/600 |
| 2020/0166906 | A1* | 5/2020 | Wang | G05B 19/4069 |
| 2021/0325844 | A1* | 10/2021 | Yu | G06F 3/0481 |

FOREIGN PATENT DOCUMENTS

| JP | 201284079 A | * 10/2010 | ......... G05B 19/4069 |
| JP | 5666013 | 2/2015 | |
| KR | 10-2017-0033009 | 3/2017 | |

\* cited by examiner

*Primary Examiner* — Chuen-Meei Gan
(74) *Attorney, Agent, or Firm* — Wenderoth, Lind & Ponack, L.L.P.

(57) ABSTRACT

To make it possible to evaluate quantitatively whether there is a problem on a machining surface. A simulator includes a memory unit that stores machining position data to be used when a machine tool machines a machining-target object, a machining surface simulation unit that uses the machining position data that is stored to perform a simulation of a machining surface, a surface texture calculation unit that calculates a surface texture of the machining surface that is simulated through the simulation of the machining surface, and a machining surface evaluation unit that evaluates the surface texture on the basis of an evaluation condition.

6 Claims, 17 Drawing Sheets

SPECIFIED LOCATION

FIG. 10
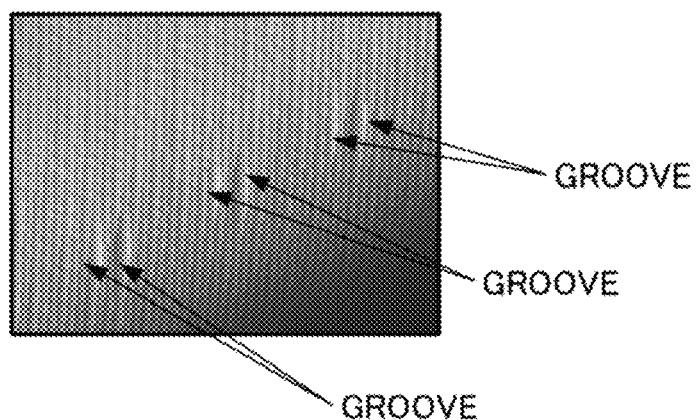
FIG. 11
FIG. 12
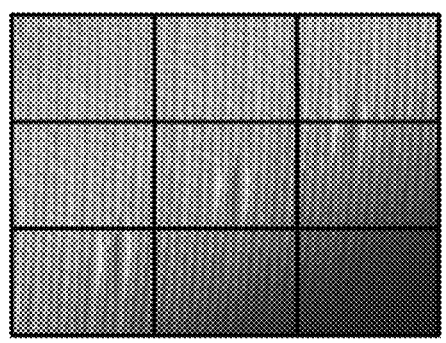

FIG. 13

| UNACCEPTABLE | 1.00 | 1.00 | 1.50 |
| | 1.00 | 1.50 | 1.20 |
| | 1.50 | 1.10 | 1.00 |

FIG. 14

| UNACCEPTABLE | 1.00 | 1.00 | 1.50 |
| | 1.00 | 1.50 | 1.20 |
| | 1.50 | 1.10 | 1.00 |

FIG. 17
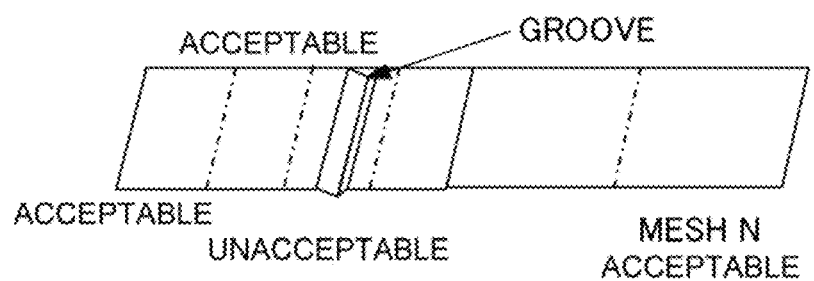
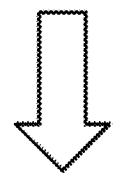
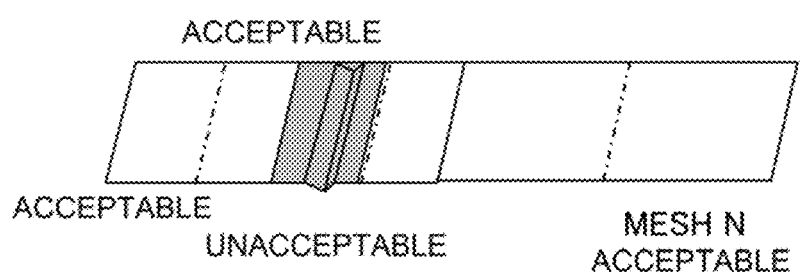

FIG. 19

```
<MACHINING SURFACE EVALUATION RESULT>

UNACCEPTABLE

* * * * * * * * * * * *
MESH SIZE = 0.1 mm²
EVALUATION CONDITION (ACCEPTABLE)
= Sz < 1.10 μm

TOTAL MESH COUNT = 1000
UNACCEPTABLE MESH COUNT = 58
```

SIMULATOR, NUMERICAL CONTROL DEVICE, AND SIMULATION METHOD

This application is based on and claims the benefit of priority from Japanese Patent Application No. 2019-236557, filed on 26 Dec. 2019, the content of which is incorporated herein by reference.

BACKGROUND OF THE INVENTION

Field of the Invention

The present invention relates to simulators, numerical control devices, and simulation methods. The present invention in particular relates to a simulator that performs a simulation of a machining surface of a machining-target object that a machine tool machines, a numerical control device, and a simulation method.

Related Art

Conventionally, a system has been known that renders a model of an object through a simulation to identify a defect on a surface of the object from the model (for example, see Japanese Patent No. 5666013). Japanese Patent No. 5666013 describes that an orientation of a surface and a rate of change in the orientation are acquired on the basis of a normal vector with respect to the surface to identify a defect on the surface on the basis of the rate of change and a threshold value. It is also described that the threshold value is acquired on the basis of a machine-cutting process.
Patent Document 1: Japanese Patent No. 5666013

SUMMARY OF THE INVENTION

There has conventionally been a simulation of a machining surface, which serves as an effective simulation method for determining whether there is a problem on the machining surface of a workpiece that a machine tool machines.

When a simulation of the machining surface is performed, an evaluation of whether there is a problem on the machining surface is performed by a user visually. In this case, as the user makes a determination on the basis of his or her subjective view point, the user may observe a different location, possibly resulting in the user making a different determination of whether there is a problem on the machining surface. The user also faces difficulties in numerically determining whether the machining satisfies the required accuracy. Furthermore, the result of determining whether there is a problem on a machining surface differs depending on the skill (for example, how light is applied, and display settings including the line of sight angle) of the user performing the simulation of the machining surface, possibly leading to a failure to find the problematic location. It is therefore desired to quantitatively evaluate whether there is a problem on the machining surface.

(1) A simulator according to a first aspect of the present disclosure is a simulator including:
 a memory unit that stores machining position data to be used when a machine tool machines a machining-target object;
 a machining surface simulation unit that uses the machining position data that is stored to perform a simulation of a machining surface;
 a surface texture calculation unit that calculates a surface texture of the machining surface that is simulated through the simulation of the machining surface; and
 a machining surface evaluation unit that evaluates the surface texture on the basis of an evaluation condition.

(2) A numerical control device according to a second aspect of the present disclosure is a numerical control device including:
 the simulator according to (1) described above; and
 a control unit that generates a control command that causes servo control of a servo motor on the basis of a machining program.

(3) A simulation method according to a third aspect of the present disclosure is a simulation method including:
 storing machining position data to be used when a machine tool machines a machining-target object;
 using the machining position data that is stored to perform a simulation of a machining surface;
 calculating a surface texture of the machining surface that is simulated through the simulation of the machining surface; and evaluating the surface texture on the basis of an evaluation condition.

The aspects of the present disclosure allow quantitative evaluation of whether there is a problem on a machining surface, making it possible to prevent the user from making a different determination. It is also possible to determine numerically whether the machining satisfies the required accuracy.

BRIEF DESCRIPTION OF THE DRAWINGS

FIG. 10 is a view showing the result of a machining surface simulation;

FIG. 11 is a view showing the machining surface divided into nine portions;

FIG. 12 is a view of the machining surface, showing the result of calculation of a surface texture for each of the nine divided portions of the machining surface;

FIG. 13 is a view of the machining surface, showing regions which fall outside of an allowable range surrounded by a square with a thick line;

FIG. 14 is a view of a machining surface, showing regions which fall outside of the allowable range surrounded by a square with a thick line, when different threshold values are applied for the allowable range;

FIG. 17 is a view showing machining surfaces in a case where the color of a region with a groove and the color of a region with no groove are changed;

FIG. 19 is a view showing an evaluation table describing the result of an evaluation by a machining surface evaluation unit;

DETAILED DESCRIPTION OF THE INVENTION

Herein, an embodiment of the present invention will now be described in detail with reference to the accompanying drawings.

Figure 1:
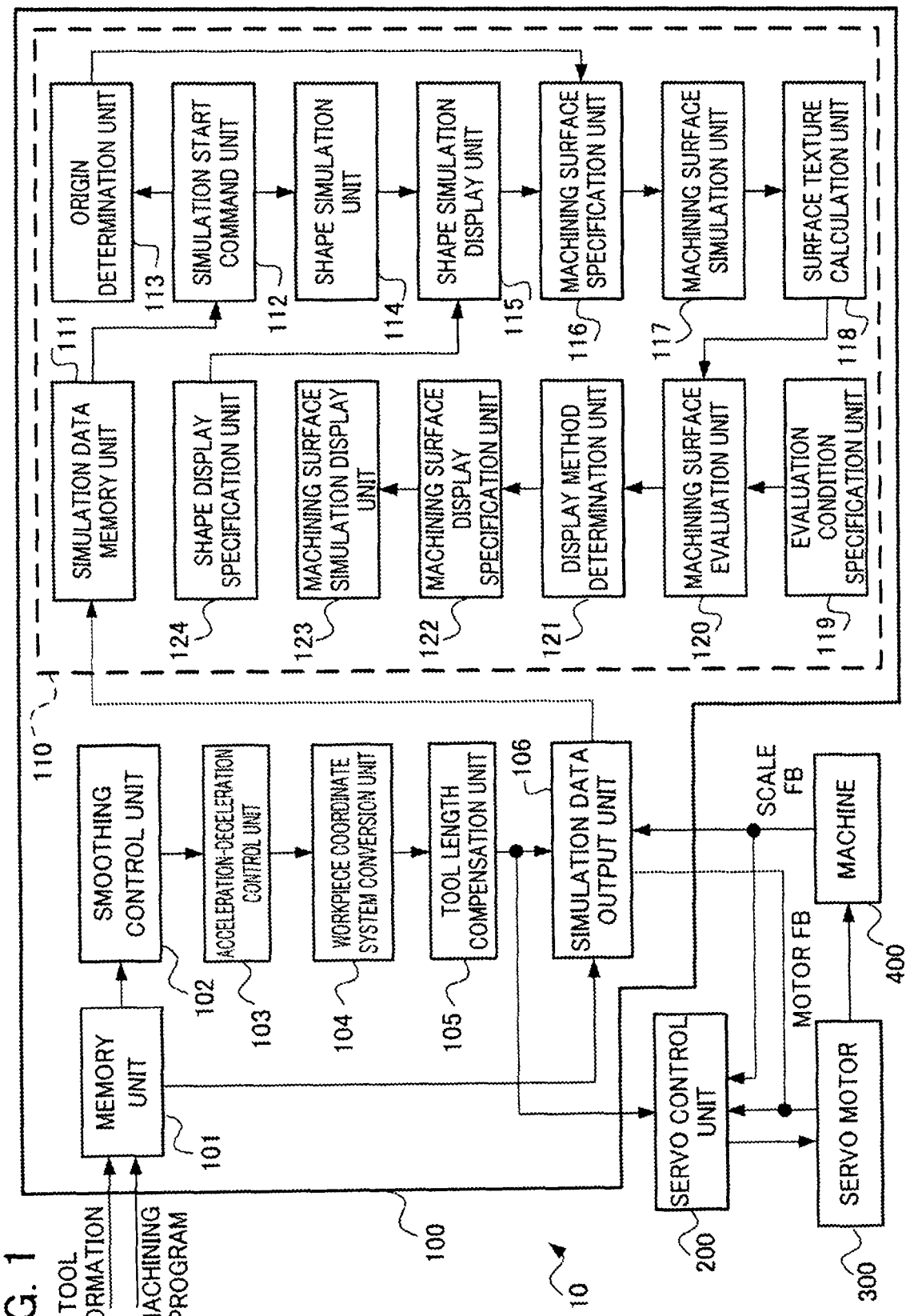
FIG. 1 is a block diagram showing a configuration example of a numerically controlled machine system including a numerical control device according to an embodiment of the present invention.

FIG. 1 is a block diagram showing a configuration example of a numerically controlled machine system including a numerical control device according to an embodiment of the present invention. The numerically controlled machine system (hereinafter referred to as an NC machine system) 10 illustrated in FIG. 1 includes a numerical control device (hereinafter referred to as an NC device) 100, a servo control unit 200, a servo motor 300, and a machine 400. The machine 400 represents a machine tool that performs machining by cutting, for example. The NC device 100 may be included in the machine 400. The servo motor 300 may also be included in the machine 400. In a case where the machine 400 has a plurality of axes, such as three axes of an X axis, a Y axis, and a Z axis, the servo control unit 200 and the servo motor 300 are provided for each axis.

The NC device 100 includes a memory unit 101, a smoothing control unit 102, an acceleration-deceleration control unit 103, a workpiece coordinate system conversion unit 104, a tool length compensation unit 105, a simulation data output unit 106, and a simulation unit 110. The simulation unit 110 constitutes a simulator.

The memory unit 101 stores a machining program and tool information. The machining program includes a command path (arrangement of command points) indicative of a machining path. The machining program is calculated through computer aided design (CAD) and computer aided manufacturing (CAM). On the basis of a machining execution command, the machining program and the tool information are read from the memory unit 101, and are entered into the smoothing control unit 102 and the simulation data output unit 106. The machining program includes the command path indicating the machining path, which is to be served as machining position data.

The smoothing control unit 102 performs a smoothing control on a moving path on the basis of move commands indicated in the machining program. Specifically, the smoothing control unit 102 compensates the move commands into a smooth path, and then interpolates points on the compensated moving path with an interpolation cycle (path compensation).

The acceleration-deceleration control unit 103 generates a moving speed pattern on the basis of the move commands interpolated by the smoothing control unit 102, the acceleration and deceleration based on acceleration and deceleration time constants, and the maximum speed, and generates a position command on the basis of the moving speed pattern, and outputs the generated position command to the workpiece coordinate system conversion unit 104. The smoothing control unit 102 and the acceleration-deceleration control unit 103 serve as a control unit that generates a control command that causes servo control of the servo motor 300. The position command serves as a control command that causes servo control of the servo motor 300 that drives the machine tool.

The workpiece coordinate system conversion unit 104 converts, into a machine coordinate, a workpiece coordinate for the position command that the acceleration-deceleration control unit 103 outputs, and outputs, to the tool length compensation unit 105, the position command where the workpiece coordinate is converted into the machine coordinate.

When a tool is exchanged, for example, the tool length compensation unit 105 compensates the machine coordinates for the position command in accordance with the length of the tool, and outputs the compensated position command to the servo control unit 200 and the simulation data output unit 106.

The simulation data output unit 106 outputs, to the simulation unit 110, machining position data in the machining program that is output from the memory unit 101, the position command (to be served as machining position data) that is output from the tool length compensation unit 105, machining position data representing motor feedback information (indicated as a motor FB in the drawings) to be served as first feedback information, which is output from the servo motor 300, and machining position data representing scale feedback information (indicated as a scale FB in the drawings) to be served as secondary feedback information, which is output from the machine 400. The configuration of the simulation unit 110 will be described later.

The servo control unit 200 acquires a position error representing a difference between a position command to be input and a position detection value in at least either of the motor feedback information or the scale feedback information, and uses the position error to calculate a speed command, and further generates a torque command on the basis of the speed command, and outputs the commands to the servo motor 300. The motor feedback information represents a position detection value from a rotary encoder associated with the servo motor 300. The scale feedback information represents a position detection value from a linear scale attached to the machine 400. The servo control unit 200 does not need to use two types of information, which are motor feedback information that is output from the servo motor 300 and scale feedback information that is output from the machine 400, to perform feedback control.

For example, scale feedback information may not be entered into the servo control unit 200, but may be output to the simulation data output unit 106 only.

Figure 2:
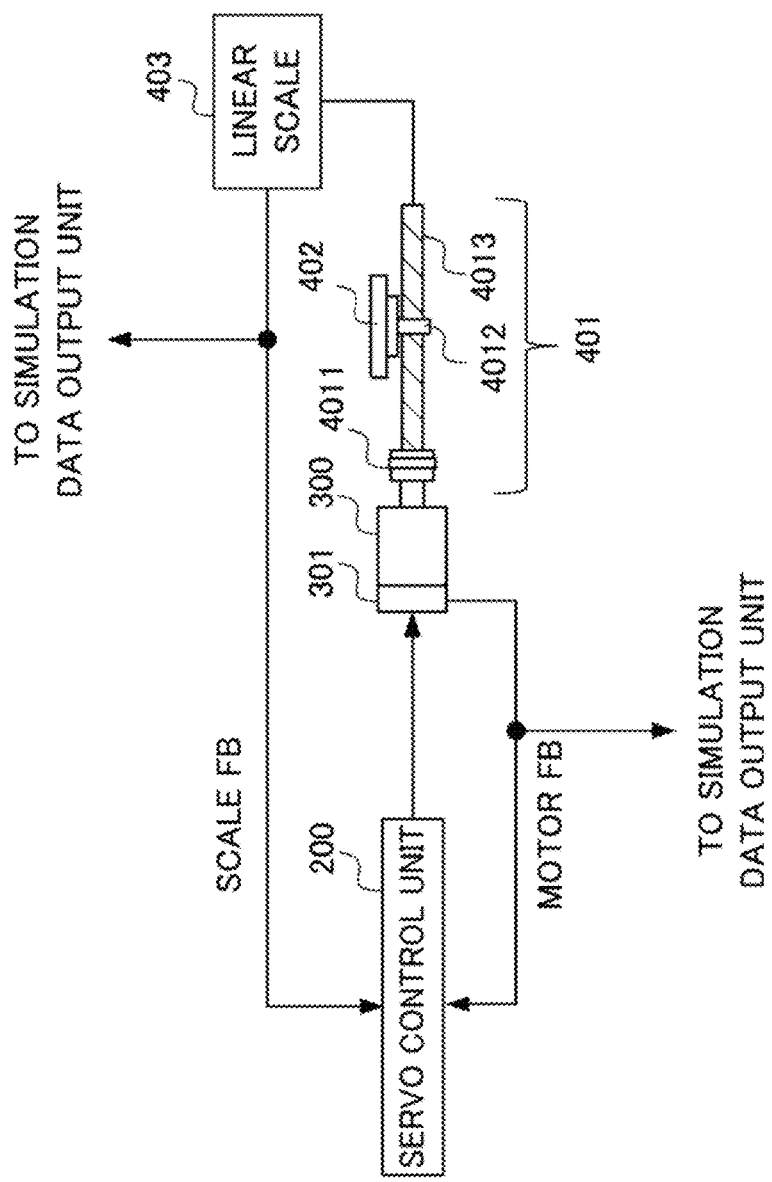
FIG. 2 is a schematic diagram showing a servo motor and part of a machine.

FIG. 2 is a block diagram showing the servo motor and part of the machine. The servo control unit 200 causes the servo motor 300 to move a table 402 via a coupling mechanism 401 to machine a machining-target object (workpiece) placed on the table 402. The coupling mechanism 401 includes a coupling 4011 coupled to the servo motor 300, and a ball screw 4013 (that serves as a movable part) fixed to the coupling 4011. A nut 4012 screws together with the ball screw 4013. Under rotation drive of the servo motor 300, the nut 4012 that screws together with the ball screw 4013 moves in an axial direction of the ball screw 4013. The coupling mechanism 401 and the table 402 constitute part of the machine 400.

A rotation angle position of the servo motor 300 is detected by a rotary encoder 301 that is associated with the servo motor 300 and that serves as a position detection unit. The detected signal is integrated and is output as motor feedback information to the servo control unit 200 and the simulation data output unit 106. Scale feedback information represents a position detection value from the linear scale 403 attached at the end of the ball screw 4013 of the machine 400. The linear scale 403 detects the moving distance of the ball screw 4013, and outputs its output as scale feedback information to the servo control unit 200, and enters the output as positional information of the ball screw 4013 serving as the movable part of the machine 400 to the simulation data output unit 106.

The simulation unit 110 includes a simulation data memory unit 111, a simulation start command unit 112, an origin determination unit 113, a shape simulation unit 114, a shape simulation display unit 115, a machining surface specification unit 116, a machining surface simulation unit 117, a surface texture calculation unit 118, an evaluation condition specification unit 119, a machining surface evaluation unit 120, a display method determination unit 121, a machining surface display specification unit 122, a machining surface simulation display unit 123, and a shape display specification unit 124.

The simulation data memory unit 111 stores machining position data in the machining program, which is output from the simulation data output unit 106, machining position data that is output from the tool length compensation unit 105, machining position data that is output from the servo motor 300, and machining position data that is output from the machine 400.

Upon entry of a simulation start request regarding the machining position data that is output from the tool length compensation unit 105 into the NC device 100, the simulation start command unit 112 reads, from the simulation data memory unit 111, the machining position data that is output from the tool length compensation unit 105, and sends, together with the machining position data that is output from the tool length compensation unit 105, a simulation start command to the origin determination unit 113 and the shape simulation unit 114. Note that the machining position data that is output from the tool length compensation unit 105 represents machining position data for a machine coordinate system. Note that the machining position data used to perform a simulation is not particularly limited to the machining position data that is output from the tool length compensation unit 105, but may be one of the other three types of machining position data, that is, one of the machining position data in the machining program, machining position data that is output from the servo motor 300, and machining position data that is output from the machine 400.

The origin determination unit 113 receives, from the simulation start command unit 112, the machining position data that is output from the tool length compensation unit 105 and the simulation start command, and determines an origin (hereinafter referred to as an origin for the machining surface simulation) for determining an area for which the machining surface simulation is to be performed, and outputs, to the machining surface specification unit 116, origin specification information and the machining position data that is output from the tool length compensation unit 105.

The origin determination unit 113 may regard the origin for the machining surface simulation as the origin of the workpiece coordinate system. Since machining position data that is output from the tool length compensation unit 105 represents machining position data for the machine coordinate system, the origin of the workpiece coordinate system is acquired through the conversion of machining position data for the machine coordinate system into machining position data for the workpiece coordinate system.

The reason why the origin for the machining surface simulation is regarded as the origin of the workpiece coordinate system will be described below. In the case where a user deals with a workpiece displayed on the shape simulation display unit 115 described later, and, to compare results of two machining surface simulations, the user visually defines the areas for which machining surface simulations are to be performed, a difference may arise between the areas for which the machining surface simulations are to be performed, possibly affecting the result of the evaluation.

Figure 3:
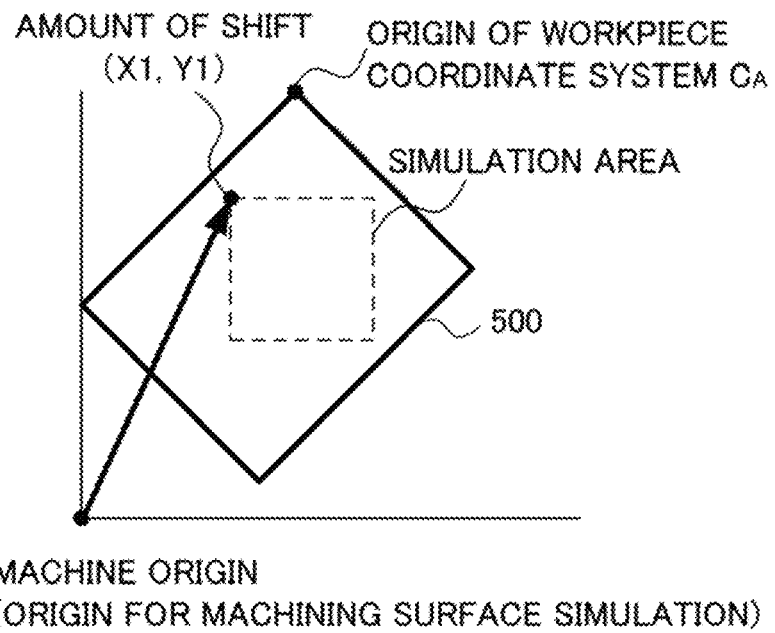
FIG. 3 is a view showing an example where an origin for a machining surface simulation is set to an origin of a machine coordinate system.
Figure 4:
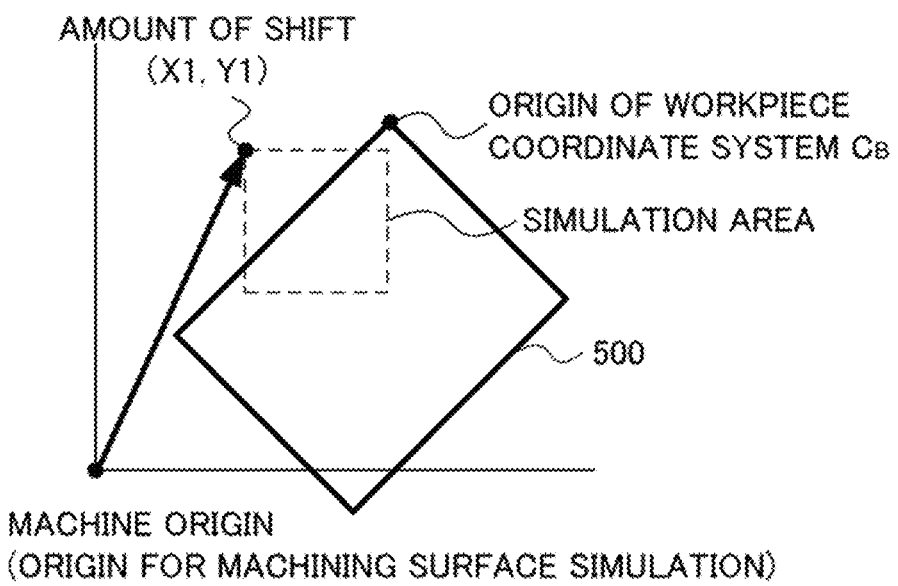
FIG. 4 is a view showing another example where the origin for the machining surface simulation is set to the origin of the machine coordinate system.

Even in the case where the user sets the origin for machining surface simulations to the origin of the machine coordinate system (a machine origin), and sets areas for the machining surface simulations so each make a shift by a certain amount from the machine origin, the user is not always able to confirm and evaluate the identical areas on a machining surface, due to differences between workpiece coordinate systems. For example, as illustrated in FIGS. 3 and 4, in the case where the origin of the workpiece coordinate system $C_A$ and the origin of the workpiece coordinate system $C_B$ lie at different positions on the machine coordinates, and the user sets the origin for machining surface simulations on workpiece 500 to the machine origin (0, 0), and sets areas for the machining surface simulations so each make a shift by a certain amount (X1, Y1) from the machine origin, the areas for the machining surface simulations become different from each other on the machining surface, possibly affecting the result of the evaluation.

Figure 5:
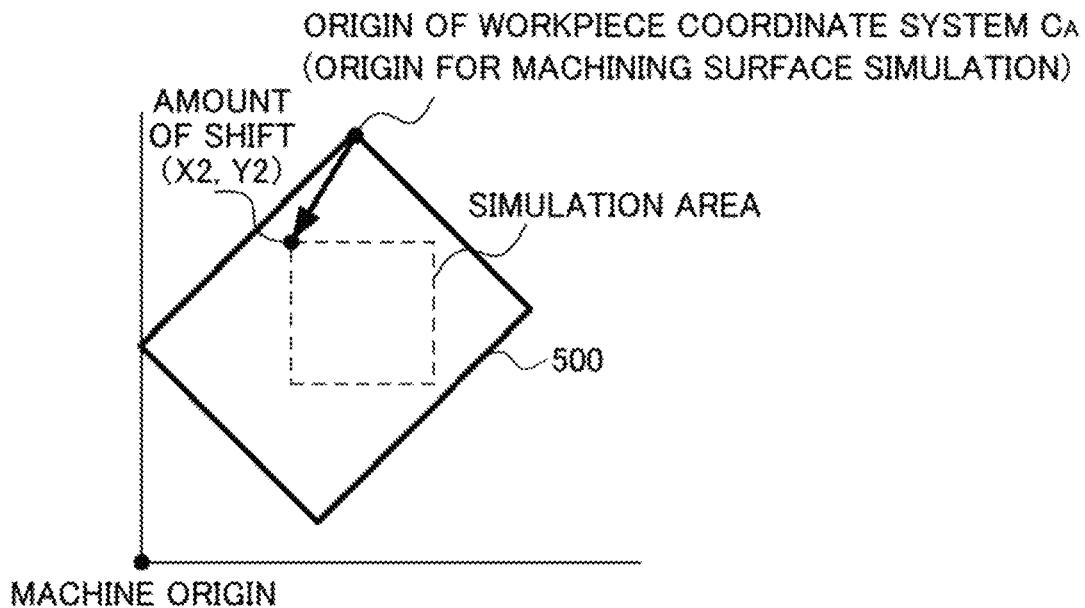
FIG. 5 is a view showing an example where the origin for the machining surface simulation is set to the origin of a workpiece coordinate system.
Figure 6:
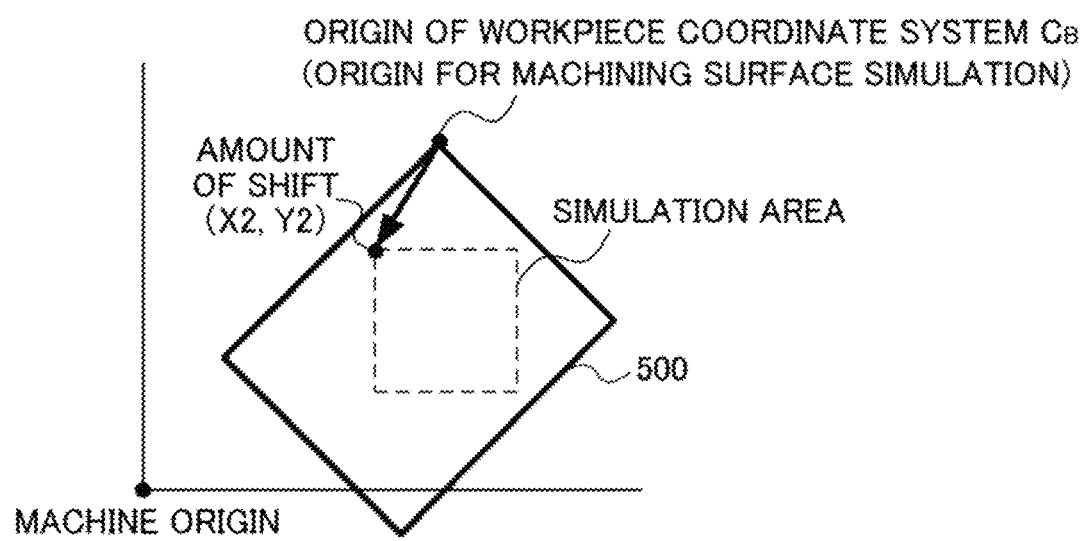
FIG. 6 is a view showing another example where the origin for the machining surface simulation is set to the origin of the workpiece coordinate system.

Therefore, the origin determination unit 113 regards the origin for the machining surface simulation as the origin of the workpiece coordinate system to calculate origin specification information. The machining surface specification unit 116 then sets the areas for the machining surface simulations so each make a shift by a certain amount from the origin of the workpiece coordinate system. As a result, for example, as illustrated in FIGS. 5 and 6, even when the origin of the workpiece coordinate system $C_A$ and the origin of the workpiece coordinate system $C_B$ lie at different positions on the machine coordinates, the origins for the machining surface simulations on the workpiece 500 are respectively set to the origin of the workpiece coordinate system $C_A$ and the origin of the workpiece coordinate system $C_B$ and the areas for the machining surface simulations are respectively set so as to each make a shift by a certain amount from the origin of the workpiece coordinate system $C_A$ or the origin of the workpiece coordinate system $C_B$, and the areas for the machining surface simulations thus become identical to each other on the machining surface. Therefore, even when origins for workpiece coordinate systems lie at different positions on the machine coordinates, the user is able to confirm and evaluate the same areas.

Upon receiving the simulation start command, the shape simulation unit 114 uses the machining position data that is output from the tool length compensation unit 105 to perform a shape simulation, and sends image information indicating the shape of the workpiece to the shape simulation display unit 115.

Figure 7:
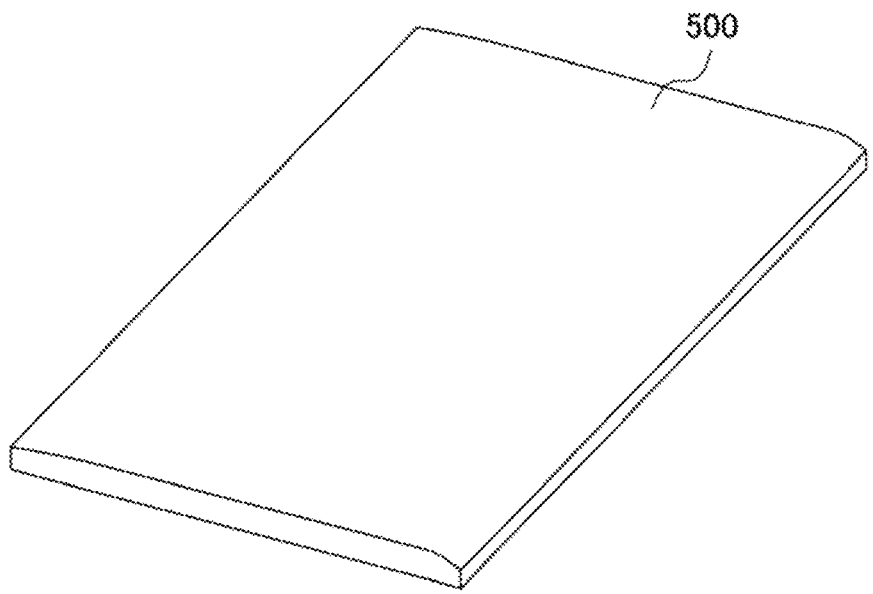
FIG. 7 is a perspective view showing a workpiece to be displayed on a screen.
Figure 8:
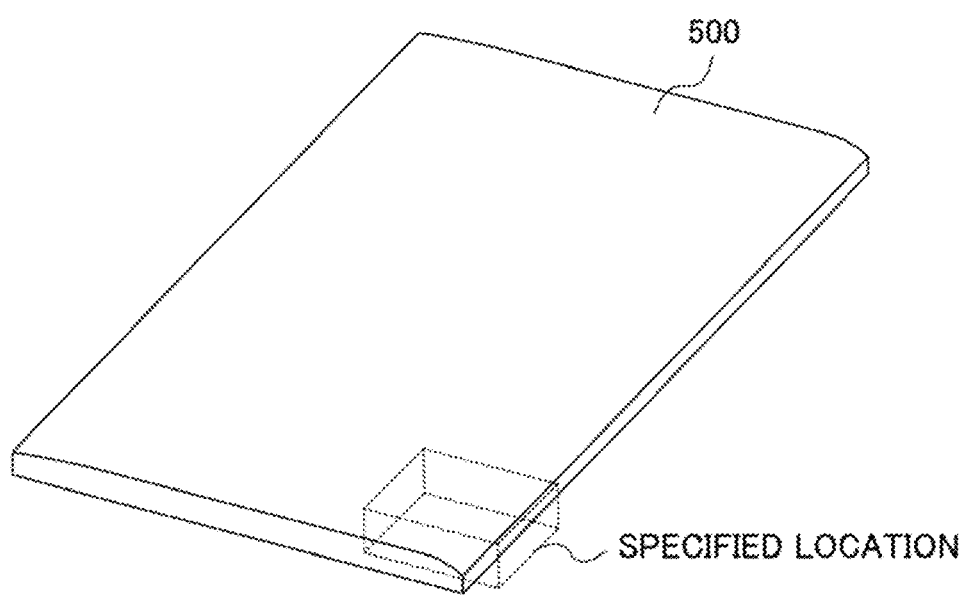
FIG. 8 is a perspective view showing a specified location on the workpiece, for which the machining surface simulation is to be performed.

The shape simulation display unit 115 displays the shape of the workpiece on a screen on the basis of the image information indicating the shape of the workpiece. FIG. 7 is a view showing the workpiece displayed on a screen, showing that the workpiece 500 represents the workpiece for which the shape simulation is performed using the machining position data that is output from the tool length compensation unit 105. The shape simulation display unit 115 is a liquid crystal display device with a touch panel, for example. The user uses the touch panel to specify the location for which the user desires to perform the machining surface simulation on the workpiece 500 illustrated in FIG. 7. FIG. 8 is a view showing the specified location on the workpiece 500, for which the machining surface simulation is to be performed. The shape simulation unit 114 receives display settings from the shape display specification unit 124 described later.

The machining surface specification unit 116 sends, to the machining surface simulation unit 117, on the basis of the specified location identified on the touch panel, coordinate information for specifying the machining surface for which the machining surface simulation is to be performed. The coordinate information specifies the area for which the machining surface simulation is to be performed. The origin of the coordinates is determined on the basis of the origin specification information that is output from the origin determination unit 113. Here, the origin of the workpiece coordinate system is used as the origin of the coordinates.

The machining surface simulation unit 117 identifies, on the basis of the coordinate information, machining position data for the machining surface for which the machining surface simulation is to be performed to execute the machining surface simulation. The machining surface for which the simulation is to be performed corresponds to the surface including the specified location illustrated in FIG. 8.

Figure 9:
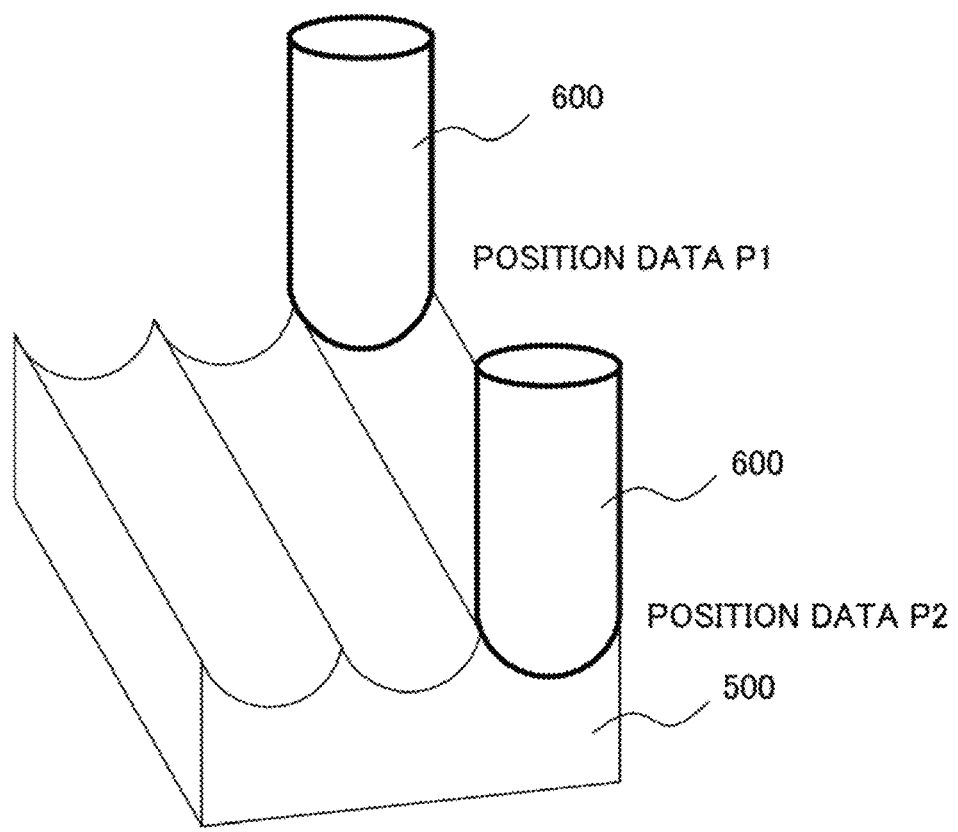
FIG. 9 is a view for describing a simulation of a machining surface.

The machining surface simulation unit 117 receives the machining position data from the origin determination unit and uses the data for the machining surface simulation. As illustrated in FIG. 9, portions to be cut are calculated on the basis of position data and tool information to perform the machining surface simulation. The tool information regarding a tool 600 includes, for example, ball end mill, and the ball radius R1 (unit: mm). The position data includes, for example, position data P1 of X90.841 and position data P2 of X90.741. FIG. 9 is a view describing the machining surface simulation where the ball end mill serving as the tool 600 machines by cutting the workpiece 500 from the position of 90.841 to the position of 90.741 in an X-axis direction. The machining surface simulation unit 117 then outputs the result of the machining surface simulation to the surface texture calculation unit 118. FIG. 10 is a view showing the result of the machining surface simulation. As illustrated in FIG. 10, there are three pairs of grooves that are parallel to each other on the machining surface.

The surface texture calculation unit 118 calculates the surface texture of the machining surface that is machining-surface simulated, and outputs the calculated surface texture to the evaluation condition specification unit 119 and the machining surface evaluation unit 120. Surface properties (surface roughness measurements) are specified in ISO25178. It is possible to use, as a parameter indicative of a surface texture, for example, the arithmetic average height Sa, the maximum height Sz, the surface texture's aspect ratio Str, or the interface's developed area ratio Sdr. Any one of these parameters may be used. In an example result of a calculation, the surface properties of a machining surface are as follows: the arithmetic average height Sa is 0.5 μm, the maximum height Sz is 6.286 μm, the surface texture's aspect ratio Str is 0.186, and the interface's developed area ratio Sdr is 0.001761.

For example, the surface texture calculation unit 118 divides the machining surface that is machining-surface simulated for the workpiece 500 illustrated in FIG. 10 into portions each at a mesh size determined beforehand, and calculates the maximum height Sz for each of the divided portions. Although the mesh size is determined appropriately, the mesh size can be set to 0.1 mm², for example. As illustrated in FIG. 10, there are three pairs of grooves that are parallel to each other on the machining surface. Here, for example, the machining surface that is machining-surface simulated for the workpiece 500 is divided into nine portions, as illustrated in FIG. 11. The maximum height Sz is calculated for each of the divided portions. As a result of the calculation, as illustrated in FIG. 12, it is observed that the value of the maximum height Sz is 1.00 μm in four of the portions, the value of the maximum height Sz is 1.10 μm in one of the portions, the value of the maximum height Sz is 1.20 μm in one of the portions, and the value of the maximum height Sz is 1.50 μm in three of the portions.

The evaluation condition specification unit 119 specifies an evaluation condition. For example, under the evaluation condition, a value of the maximum height Sz, which is equal to or less than 1.10 μm, falls within the allowable range, and is acceptable. Here, the threshold value of 1.10 μm serves as the evaluation condition, and is determined beforehand. Note that the evaluation condition specification unit 119 may use, as the threshold value, a value that is 10% greater than the average value of the maximum height Sz of all the meshes, which are calculated by the surface texture calculation unit 118, and may regard the value of the maximum height Sz, which is equal to or less than the threshold value, falls within the allowable range, and is acceptable. For example, the average value of the maximum height Sz of all the meshes in FIG. 12 is 1.20 μm. Accordingly, the threshold value serving as the evaluation condition is 1.20 μm×1.1=1.32 μm. Under the evaluation condition, a value of the maximum height Sz, which is equal to or less than 1.32 μm, falls within the allowable range, and is acceptable.

The machining surface evaluation unit 120 evaluates, on the basis of the evaluation condition specified by the evaluation condition specification unit 119, whether the surface texture of the machining surface falls within the allowable range. For example, the machining surface evaluation unit 120 determines that, in a case where the threshold value for the allowable range is 1.10 μm, and when the value of the maximum height Sz is 1.00 μm and 1.10 μm, the values fall within the allowable range. The machining surface evaluation unit 120 determines that, when the value of the maximum height Sz is 1.20 μm and 1.50 μm, the values fall outside of the allowable range, i.e., determines the values as unacceptable or No Good (NG). FIG. 13 shows regions each surrounded by a square with a thick line, values of which fall outside of the allowable range. The machining surface evaluation unit 120 also determines that, in the case where the threshold value for the allowable range is 1.32 µm, and when the value of the maximum height Sz is 1.00 µm, 1.10 µm, and 1.20 µm, the values fall within the allowable range. The machining surface evaluation unit 120 determines that, when the value of the maximum height Sz is 1.40 µm and 1.50 µm, the values fall outside of the allowable range, i.e., determines the values as unacceptable or No Good (NG). FIG. 14 shows regions each surrounded by a square with a thick line, values of which fall outside of the allowable range. Note that, upon evaluation by the machining surface evaluation unit 120, the surface texture calculation unit 118 may change the mesh size or position at which the machining surface is divided into mesh to calculate the surface texture. The evaluation condition specification unit 119 may set the threshold value serving as the evaluation condition, in accordance with the mesh size. The machining surface evaluation unit 120 may evaluate whether, for each of the meshed regions, the surface texture of the machining surface falls within the allowable range.

Figure 15:
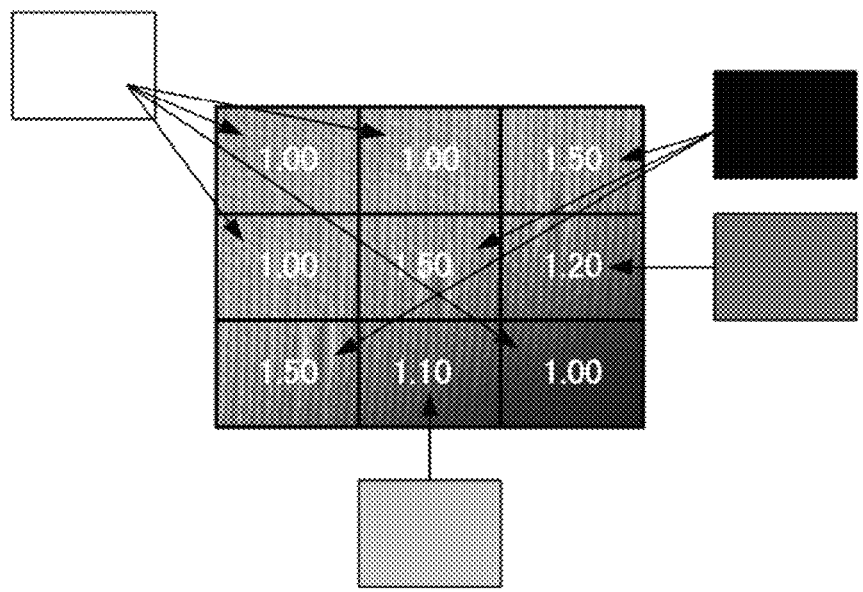
FIG. 15 is a view showing how to form a screen that displays gradations that differ from each other in accordance with the magnitude of value of the maximum height Sz.
Figure 16:
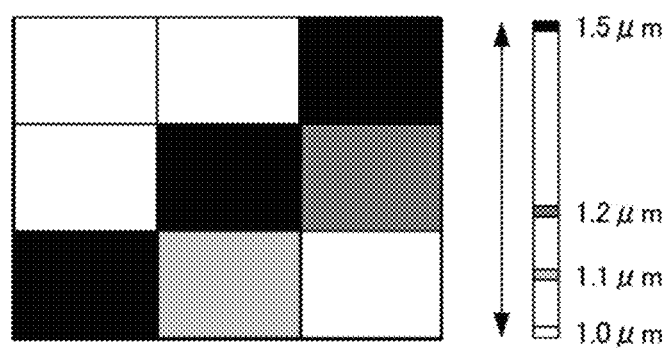
FIG. 16 is a view showing a machining surface arranged with white, gray, and black colored regions.

The display method determination unit 121 determines a method of displaying the result of the evaluation by the machining surface evaluation unit 120. FIG. 15 is a view showing how to form a screen that displays gradations that differ from each other in accordance with the magnitude of value of the maximum height Sz. In FIG. 15, in the case where the value of the maximum height Sz is 1.00 µm, 1.10 µm, 1.20 µm, and 1.50 µm, the region where the value of the maximum height Sz is 1.00 µm is colored in white, the region where the value of the maximum height Sz is 1.50 µm is colored in black, and regions where the value of the maximum height Sz is 1.10 µm and 1.20 µm are colored in gray with gradations that differ from each other. FIG. 16 is a view showing a machining surface arranged with white, gray, and black colored regions. Although FIG. 16 shows opaque white, gray, and black colored regions, translucent white, gray, and black colored regions may be arranged so as to make concavity and convexity of the machining surface viewable.

Note that, although FIG. 16 shows the result of an evaluation with achromatic white, gray, and black colors, the result may be displayed in chromatic colors. For example, on the basis of a hue circle, the color of the region where the value of the maximum height Sz is 1.00 µm and the color of the region where the value of the maximum height Sz is 1.50 µm are allowed to constitute complementary colors, so that the region where the value of the maximums height Sz is 1.10 µm and the region where the value of the maximum height Sz is 1.20 µm are colored in intermediate colors between the color of the region where the value of the maximum height Sz is 1.00 µm and the color of the region where the value of the maximum height Sz is 1.50 µm. Specifically, it is possible that the region where the value of the maximum height Sz is 1.00 µm be colored in blue, the region where the value of the maximum height Sz is 1.10 µm be colored in bluish green, the region where the value of the maximum height Sz is 1.20 µm be colored in yellowish green, and the region where the value of the maximum height Sz is 1.50 µm be colored in yellowish orange.

Although, in the display method described above, such an example has been described that displays gradations that differ from each other in accordance with the magnitude of the value of the maximum height Sz, the portion that is determined as unacceptable as a result of the evaluation may be colored in a different manner from the portion that is determined as acceptable so as to display clearly the portion that is determined as unacceptable. For example, as illustrated in FIG. 13, in the case where, when the value of the maximum height Sz is 1.00 µm and 1.10 µm, the values are determined to fall within the allowable range (as acceptable), and, when the value of the maximum height Sz is 1.20 µm and 1.50 µm, the values are determined to fall outside of the allowable range (as unacceptable), it is possible that regions where the value of the maximum height Sz is 1.00 µm and 1.10 µm be colored in white, and regions where the value of the maximum height Sz is 1.20 µm and 1.50 µm be colored in achromatic black or chromatic red.

Note that, as illustrated in FIG. 17, the display method determination unit 121 changes, the color of the region with no groove and the color of the region with a groove, making it possible to display more clearly the region with the groove. For example, the region with no groove can be colored in white, and the region with a groove can be colored in achromatic black or chromatic red.

Figure 18:
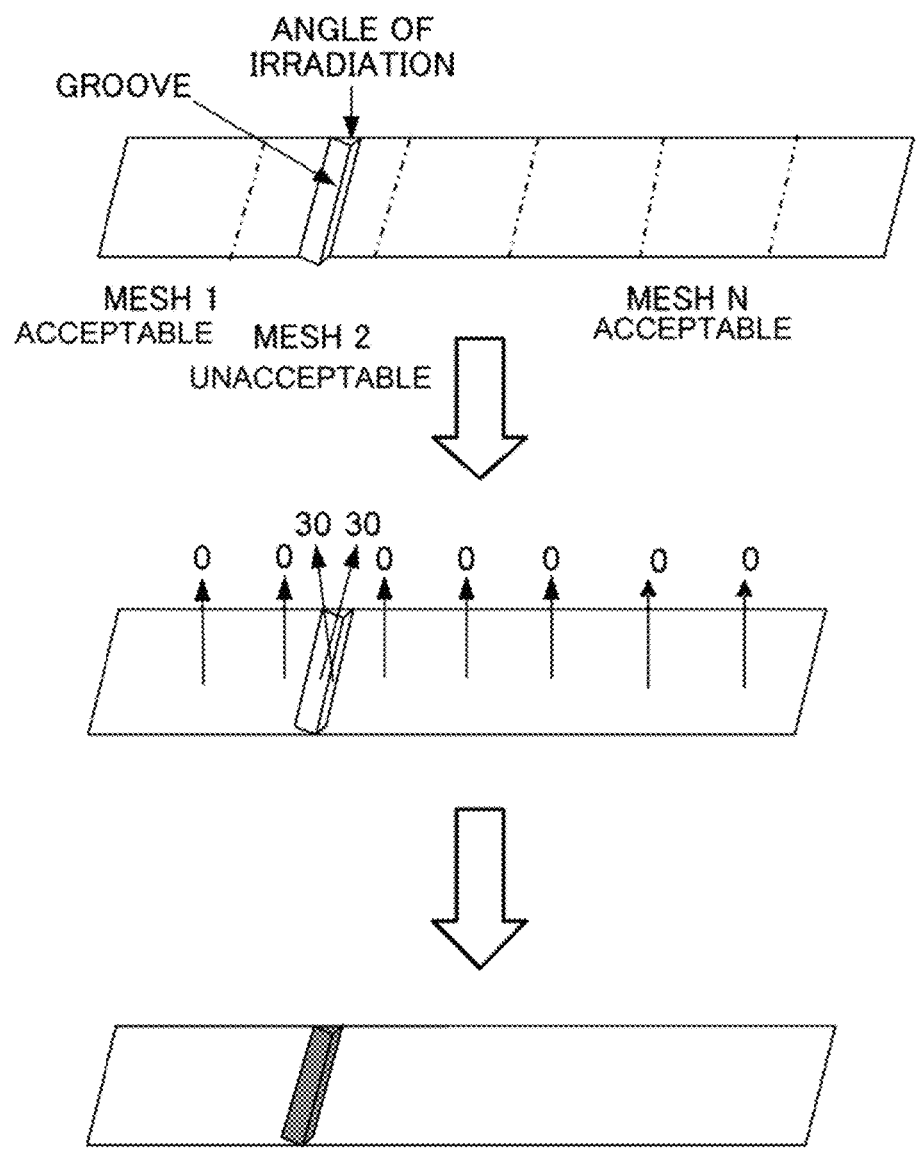
FIG. 18 is a view showing how to adjust the angle of irradiation toward a region that is found to be unacceptable to light and dark using the angle between the angle of irradiation and a normal vector with respect to the machining surface.

The machining surface display specification unit 122 provides display settings for the machining surface simulation display unit 123. The user uses the machining surface display specification unit 122 to adjust display brightness, the angle of irradiation, and the line of sight angle for the machining surface that is machining-surface simulated. For example, as illustrated in FIG. 17, in the case where the display method determination unit 121 changes the color of the region with no groove and the color of the region with a groove, the machining surface display specification unit 122 adjusts, as illustrated in FIG. 18, the angle of irradiation toward the region that is found unacceptable to acquire the angle between the angle of irradiation and a normal vector with respect to the machining surface. FIG. 18 shows the case where the angle formed by the angle of irradiation and the normal vector with respect to the machining surface are 0° and 30°. The machining surface display specification unit 122 then applies shades (contrasts) in accordance with the angles. In FIG. 18, the angle of irradiation and the normal vector with respect to the machining surface form an angle of 30° in the region with a groove. In this case, in the region that is found unacceptable, only the grooved portion where the angle of irradiation and the normal vector with respect to the machining surface form an angle of 30° is colored.

The machining surface simulation display unit 123 uses the display method determined by the display method determination unit 121 to display, with the display settings specified by the machining surface display specification unit 122, the result of the machining surface simulation. The machining surface simulation display, unit 123 is a liquid crystal display device with a touch panel, for example. The machining surface simulation display unit 123 may also use the liquid crystal display device with the touch panel, which is used by the shape simulation display unit 115. The result of the machining surface simulation, which is displayed on the machining surface simulation display unit 123, includes the machining surface arranged with white, gray, and black colored regions, as illustrated in FIG. 16, the machining surface where the region with no groove is colored in white and the region with a groove is colored in achromatic black or chromatic red, as illustrated in FIG. 17, or the machining surface where only the grooved portion where the angle of irradiation and the normal vector with respect to the machining surface form an angle of 30° is colored, as illustrated in FIG. 18, for example.

The result of the evaluation by the machining surface evaluation unit 120 is not limited to the display of an image of the machining surface, as illustrated in FIG. 16, 17, or 18, but may be displayed through an evaluation table based on text, as illustrated in FIG. 19. An image of the machining surface, as illustrated in FIG. 16, 17, or 18, and an evaluation table based on text, as illustrated in FIG. 19, may both be displayed. In the case where the unacceptable mesh count with respect to the total mesh count reaches a certain ratio, such as 2% or more, the result of an evaluation of the machining surface can be determined as unacceptable. FIG. 19 shows an example where the total mesh count is 1000, and the unacceptable mesh count is 58, and thus the result of the evaluation of the machining surface is determined as unacceptable.

The result of the evaluation by the machining surface evaluation unit 120 may also be printed with a printer, be sent to a portable terminal or a management-purpose computer, or be recorded on a memory device.

To achieve the functional blocks included in the NC device 100 or the simulation unit 110 illustrated in FIG. 1, the NC device 100 may include a computer including an arithmetic processing unit such as a central processing unit (CPU). The NC device 100, for example, further includes an auxiliary storage such as a hard disk drive (HDD) that stores programs for various types of control, including application software and an operating system (OS), and a main storage such as a random access memory (RAM) that stores data that the arithmetic processing unit temporarily requires to execute the programs.

In the NC device 100 or the simulation unit 110, the arithmetic processing unit then reads the application software and the OS from the auxiliary storage, deploys the application software and the OS into the main storage, and performs arithmetic processing on the basis of the application software and the OS. On the basis of the result of the arithmetic processing, various types of hardware included in the NC device are further controlled. Therefore, the functional blocks according to the embodiment are achieved. That is, the embodiment can be achieved when the hardware and the software cooperate with each other.

Figure 20:
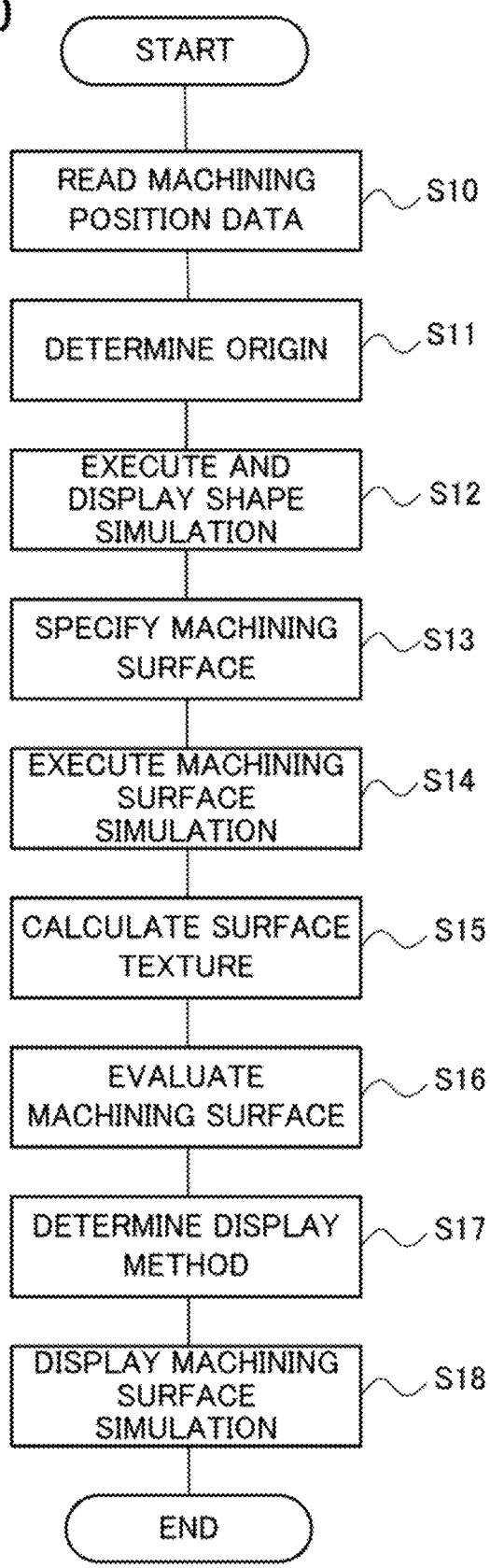
FIG. 20 is a flowchart showing the operation of the simulation unit.

Next, the operation of the simulation unit 110 will be described with reference to FIG. 20. At Step S10, the simulation start command unit 112 reads, upon the entry of a simulation start request into the NC device 100, machining position data that is output from the tool length compensation unit 105, from the simulation data memory unit 111. After that, the simulation start command unit 112 sends the simulation start command together with the machining position data that is output from the tool length compensation unit 105 to the origin determination unit 113 and the shape simulation unit 114.

At Step S11, the origin determination unit 113 determines the origin for determining the area for which the machining surface simulation is to be performed, and outputs origin specification information and the machining position data that is output from the tool length compensation unit 105 to the machining surface specification unit 116. The origin specification information represents information that the origin for the machining surface simulation corresponds to the origin of the workpiece coordinate system.

At Step S12, the shape simulation unit 114 receives the simulation start command, and uses the machining position data that is output from the tool length compensation unit 105 to perform a shape simulation. The shape simulation display unit 115 then displays the shape of the workpiece on a screen on the basis of image information indicative of the shape of the workpiece.

At Step S13, the machining surface specification unit 116 sends coordinate information for specifying the machining surface including the location specified by the user (specified location) to the machining surface simulation unit 117. The origin of the coordinates is determined on the basis of the origin specification information that is output from the origin determination unit 113. The origin of the workpiece coordinate system is used here. The coordinate information specifies the area for which the machining surface simulation is to be performed, and indicates the amount of shift from the origin of the coordinates.

At Step S14, the machining surface simulation unit 117 identifies machining position data for the specified location on the basis of the coordinate information to execute the machining surface simulation.

At Step S15, the surface texture calculation unit 118 calculates the surface texture for each of the meshes on the machining surface that is machining-surface simulated, and outputs the surface texture that is calculated to the evaluation condition specification unit 119 and the machining surface evaluation unit 120. Specifically, the surface texture calculation unit 118 calculates a surface texture such as the maximum height Sz for each of the divided, meshed portions on the machining surface that is machining-surface simulated for the workpiece 500.

At Step S16, the machining surface evaluation unit 120 evaluates whether the surface texture of the machining surface falls within the allowable range on the basis of the evaluation condition specified by the evaluation condition specification unit 119. For example, as described above, the evaluation condition specification unit 119 regards that, under the evaluation condition, a value of the maximum height Sz, which is equal to or less than 1.10 µm, falls within the allowable range, and is acceptable. For example, the machining surface evaluation unit 120 determines that when the machining surface that is divided as illustrated in FIG. 12, the value of the maximum height Sz is 1.00 µm and 1.10 µm, the values fall within the allowable range. The machining surface evaluation unit 120 determines that, when the value of the maximum height Sz is 1.20 µm and 1.50 µm, the values fall outside of the allowable range, i.e., determines the values as unacceptable or No Good (NG).

At Step S17, the display method determination unit 121 determines the method of displaying the result of the evaluation by the machining surface evaluation unit 120. For example, as illustrated in FIG. 16, in the case where the value of the maximum height Sz is 1.00 µm, 1.10 µm, 1.20 µm, and 1.50 µm, the region where the value of the maximum height Sz is 1.00 µm is colored in white, the region where the value of the maximum height Sz is 1.50 µm is colored in black, and region where the value of the maximum height Sz is 1.10 µm and 1.20 µm are colored in gray with gradations that differ from each other.

At Step S18, with the display method determined by the display method determination unit 121, and the display settings specified by the machining surface display specification unit 122, the result of the machining surface simulation is displayed.

With the present embodiment described above, when the surface texture calculation unit 118 calculates the surface texture of the machining surface that is machining-surface simulated, and the machining surface evaluation unit 120 evaluates quantitatively the machining surface on the basis of the evaluation condition specified by the evaluation condition specification unit 119, it is possible to determine clearly whether there is a problem on the machining surface. It s also possible to allow the origin determination unit 113 to adjust automatically the origin for determining the area for which the machining surface simulation is to be performed. Furthermore, it is possible to allow the display method determination unit 121 to set the display method to display the machining surface so as to allow the user to confirm the machining surface easily.

In the embodiment described above, the target of the machining surface simulation is not limited to machining position data that is output from the tool length compensation unit 105, but may be other types of machining position data stored in the simulation data memory unit 111. Specifically, since the simulation data memory unit 111 stores, in addition to machining position data that is output from the tool length compensation unit 105, machining position data in the machining program, machining position data that is output from the servo motor 300, and machining position data that is output from the machine 400, it is also possible, for the machining position data in the machining program, the machining position data that is output from the servo motor 300, and the machining position data that is output from the machine 400, to perform sequentially machining surface simulations, similar to the machining position data that is output from the tool length compensation unit 105, and to display the results of the machining surface simulations. It is therefore possible to determine which factors, including machining program, control command such as position command, servo control, and machine operation, affects the value of the maximum height Sz.

Note that it is desirable to cause the simulation data output unit 106 to output simulation data based on a common coordinate system. In the case where the machine coordinate system is used as a common coordinate system, since machining position data in the machining program corresponds to machining position data for the workpiece coordinate system, the machining position data for the workpiece coordinate system is converted into machining position data for the machine coordinate system, and is output to the simulation unit 110. Since machining position data that is output from the tool length compensation unit 105 corresponds to machining position data for the machine coordinate system, the simulation data output unit 106 outputs the data as is to the simulation unit 110. Since machining position data that is output from the servo motor 300 and the machine 400 corresponds to incremental data, the simulation data output unit 106 stores machining position data relating to the period from the start of machining, converts the data into machining position data for the machine coordinate system, and outputs the data to the simulation unit 110.

In the embodiment described above, in the case where a shape simulation and specification of a machining surface are performed for machining position data that is output from the tool length compensation unit 105, and the machining surface simulation unit stores the data, neither shape simulation nor specification of a machining surface are required for subsequent machining position data in the machining program, subsequent machining position data that is to be output from the servo motor 300, and subsequent machining position data that is to be output from the machine 400.

For a plurality of types of data including machining position data in the machining program, machining position data that is output from the tool length compensation unit 105, machining position data that is output from the servo motor 300, and machining position data that is output from the machine 400, it is also possible to perform sequential machining surface simulations, similar to machining position data that is output from the tool length compensation unit 105, and to display the results of the machining surface simulations on a single screen. For example, in the case where machining surface simulations are performed for all types of machining position data, and the results of the machining surface simulations are displayed on a single screen, it is possible to determine which one of factors, including machining program, control command such as position command, servo control, and machine operation, affects the value of the maximum height Sz.

Although the embodiment of the present invention has been described, the components of the NC device, the simulation unit included in the NC device, and the simulator, as described above, can be achieved through hardware, software, or combinations thereof. The components may be achieved through electronic circuitry, for example. A machining simulation method cooperatively performed with each of the components described above can also be achieved through hardware, software, or combinations thereof. Here, achievement through software means achievement when a computer reads and executes a program.

Programs can be stored by using one of various types of non-transitory computer readable storage media, and can be supplied to the computer. The non-transitory computer readable storage media include various types of substantial recording media (tangible storage media). Examples of non-transitory computer readable storage media include magnetic recording media (for example, a hard disk drive), magneto-optical recording media (for example, a magneto-optical disc), compact disc read only memories (CD-RCM), compact disc-recordable (CD-R), compact disc-rewritable (CD-R/W), and semiconductor memory (for example, mask ROM, programmable ROM (PROM), erasable PROM (EPROM), flash ROM, and random access memory (RAM)).

Although the foregoing embodiment represents a preferable embodiment of the present invention, the scope of the present invention should not be limited to only the embodiment described above. Embodiments with various changes without departing from the scope of the present invention are also implementable.

Other Examples of Workpieces

Figure 21:
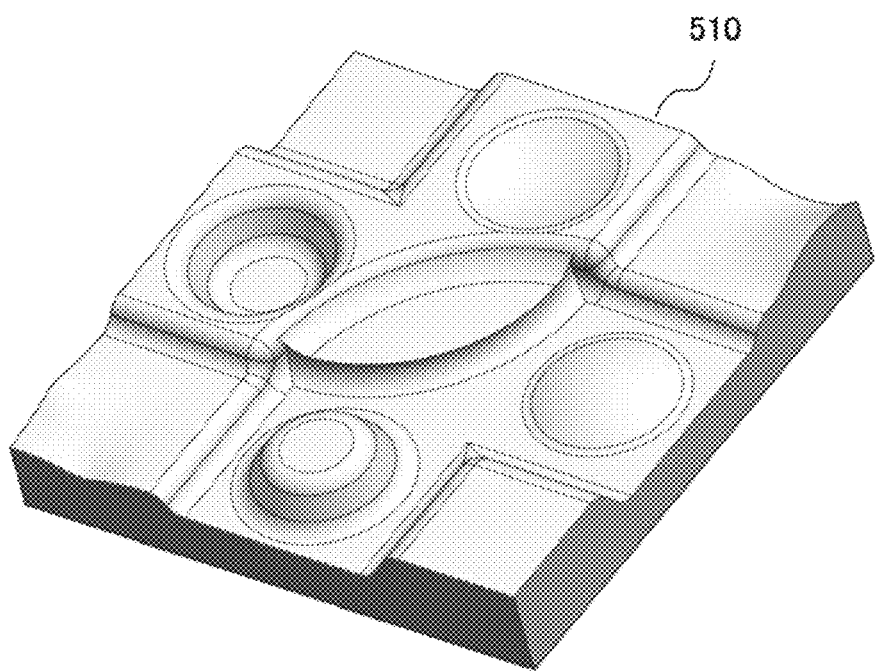
FIG. 21 is a perspective view showing a workpiece for the purpose of evaluation described in Japanese Unexamined Patent Application, Publication No. 2019-040586.

Although, in the embodiment described above, an example where the workpiece has a plate shape has been described, the workpiece may have another shape such as a disk shape. Similar to an evaluation-purpose workpiece 510 described in Japanese Unexamined Patent Application, Publication No. 2019-040586, and illustrated in FIG. 21, a workpiece that has various types of concavity and convexity formed on the machining surface is also applicable to the present embodiment. For example, on the evaluation-purpose workpiece 510, the maximum height Sz shows a maximum value of difference in height along the surface. Note that a substrate of the evaluation-purpose workpiece 510 is produced with a plurality of evaluation parts, and one or a plurality of reverse-shaped evaluation parts that each have a concave-and-convex shape that is opposite to the concave-and-convex shape of each of the plurality of evaluation parts. A first evaluation-purpose workpiece 510A and a second evaluation-purpose workpiece 510B each having a configuration identical to the configuration of the evaluation-purpose workpiece 510 are prepared. The evaluation part and the reverse-shaped evaluation part of the first evaluation-purpose workpiece 510A and the reverse-shaped evaluation part and the evaluation part of the second evaluation-purpose workpiece 510B are then respectively fitted together. The first evaluation-purpose workpiece 510A and the second evaluation-purpose workpiece 510B fitted together can then be used to evaluate the accuracy of the shapes.

A case where a workpiece has a disk shape will be described below. Even in the case where the workpiece has a disk shape, the NC machine system 10 illustrated in FIG. 1 can be used, similar to the case where the workpiece has a plate shape, to perform a machining surface simulation, and to display the result of the machining surface simulation. Even in the case where the workpiece has a disk shape, the NC machine system 10 operates identically to the case where the workpiece has a plate shape. How the simulation unit 110 operates only the case where the workpiece has a disk shape will be described below.

Upon the entry of a simulation start request into the NC device 100, the simulation start command unit 112 reads, from the simulation data memory unit 111, machining position data that is output from the tool length compensation unit 105, and sends a simulation start command, together with the machining position data that is output from the tool length compensation unit 105, to the origin determination unit 113 and the shape simulation unit 114.

The origin determination unit 113 determines the origin for determining the area for which the machining surface simulation is to be performed, and outputs the origin specification information and the machining position data that is output from the tool length compensation unit 105 to the machining surface specification unit 116.

Figure 22:
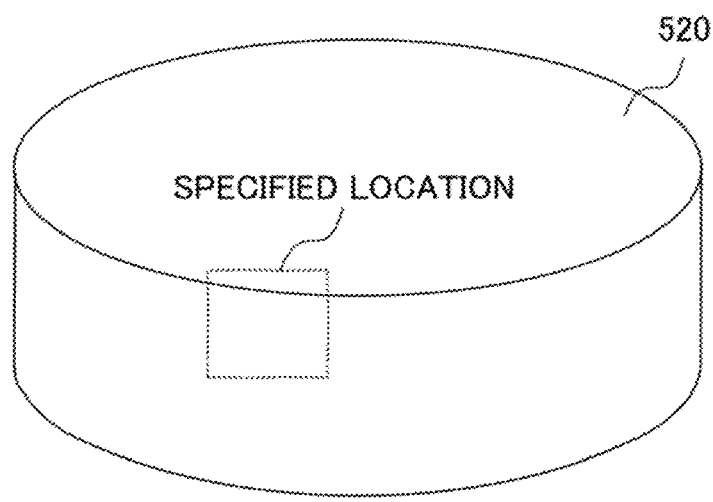
FIG. 22 is a view showing a specified location on a workpiece having a disk shape, for which a machining surface simulation is to be performed.

The shape simulation unit 114 uses the machining position data that is output from the tool length compensation unit 105 to perform a shape simulation. The shape simulation display unit 115 then displays the shape of the workpiece on a screen on the basis of the image information indicative of the shape of the workpiece. The user uses the touch panel to specify, on a workpiece 520 having the disk shape illustrated in FIG. 22, the location for which the user desires to perform the machining surface simulation. FIG. 22 is a view showing the specified location, on the workpiece 520, for which the machining surface simulation is to be performed. FIG. 22 shows an example where the side surface of the workpiece 520 having a disk-shape is specified as the specified location.

The machining surface specification unit 116 sends, to the machining surface simulation unit 117, coordinate information for specifying the machining surface including the location specified by the user (the specified location). The machining surface simulation unit 117 identifies machining position data for the specified location on the basis of the coordinate information to execute the machining surface simulation. The side surface of the workpiece 520 having a disk-shape is not smooth, but includes portions angled in the height direction.

Figure 23:
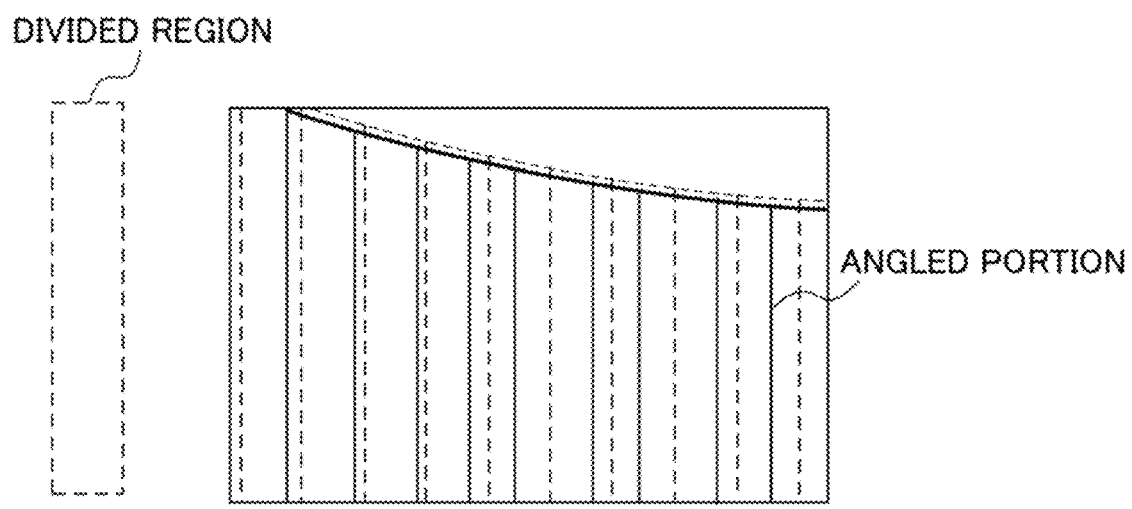
FIG. 23 is a view showing divided regions on a machining surface that is machining-surface simulated for a workpiece.

The surface texture calculation unit 118 calculates the surface texture of the machining surface that is machining-surface simulated, and outputs the surface texture that is calculated to the evaluation condition specification unit 119 and the machining surface evaluation unit 120. Specifically, the surface texture calculation unit 118 calculates a surface texture such as the maximum height Sz for each of the divided, meshed portions on the machining surface that is machining-surface simulated for the workpiece 520. FIG. 23 is a view showing divided regions on the machining surface that is machining-surface simulated for the workpiece 520. In FIG. 23, the divided regions are illustrated with dashed lines. The divided regions have angled portions.

The machining surface evaluation unit 120 evaluates, on the basis of the evaluation condition specified by the evaluation condition specification unit 119, whether the surface texture of the machining surface fails within the allowable range. The display method determination unit 121 determines the method of displaying the result of the evaluation by the machining surface evaluation unit 120. With the display method determined by the display method determination unit 121, and the display settings specified by the machining surface display specification unit 122, the result of the machining surface simulation is displayed.

Figure 24:
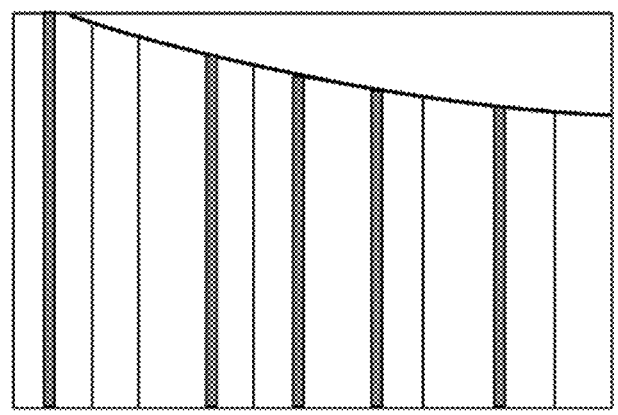
FIG. 24 is a view showing a machining surface where only angled portions are colored.

The machining surface display specification unit 122 adjusts the angle of irradiation toward a region that is found unacceptable to acquire the angle between the angle of irradiation and the normal vector with respect to the machining surface. The machining surface display specification unit 122 then regards lines along the angle between the angle of irradiation and the normal vector with respect to the machining surface changes intermittently as angled portions generated on the side surface of the workpiece 520 having a disk-shape, and applies shades (contrasts) on the lines. Only the angled portions are thus colored, as illustrated in FIG. 24.

Example Case where Simulation Unit is Provided Outside NC Device

The embodiment described above has described the example where the NC device 100 includes the simulation unit 110. The simulation unit 110 may however be provided outside of the NC device 100.

Figure 25:
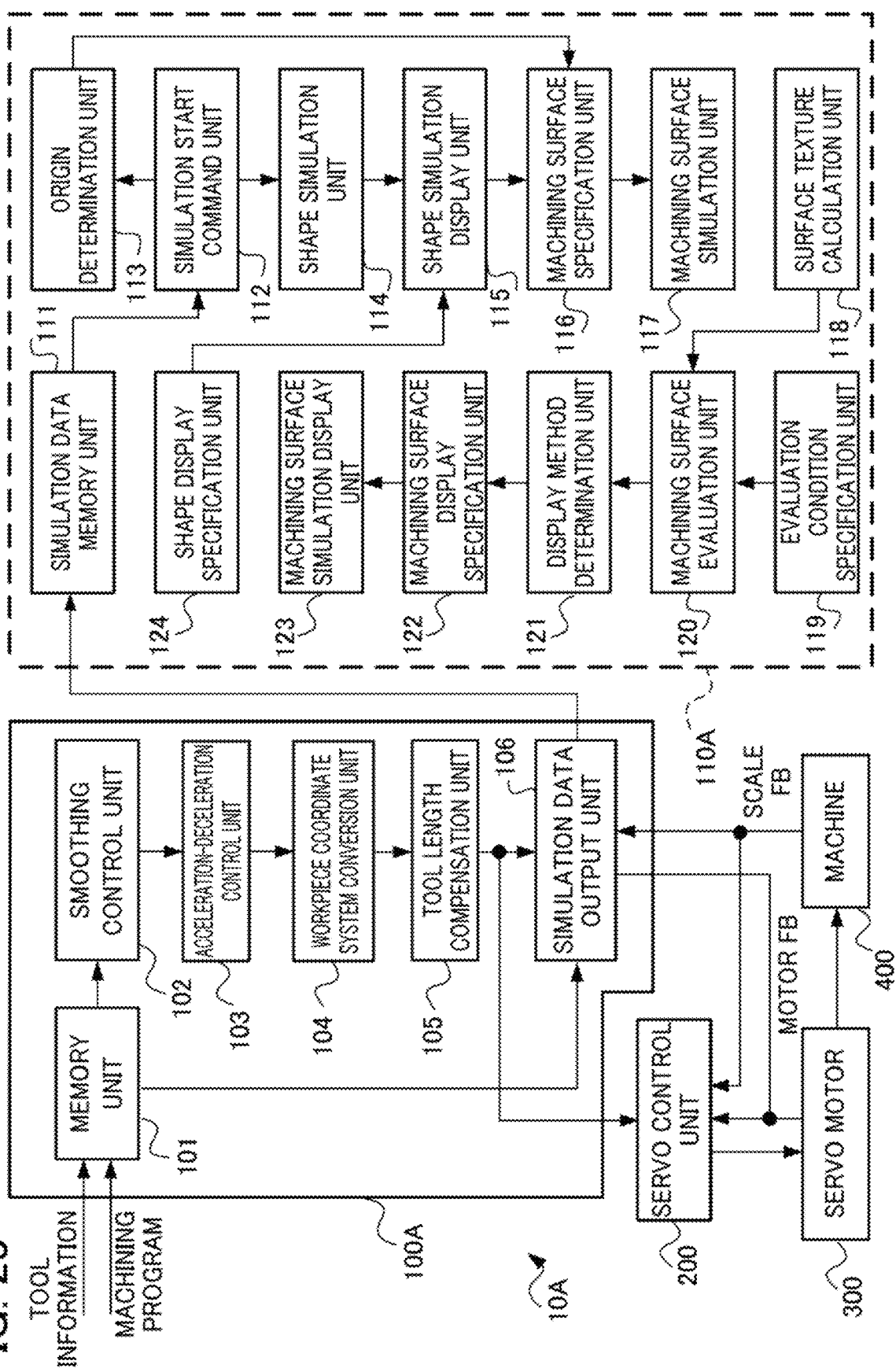
FIG. 25 is a block diagram showing a modified example of the numerically controlled machine system according to the present embodiment.

FIG. 25 is a block diagram showing a modified example of the numerically controlled machine system according to the present invention. As illustrated in FIG. 25, an NC machine system 10A includes an NC device 100A, a simulator 110A, the servo control unit 200, the servo motor 300, and the machine 400. In the NC machine system 10A, the simulator 110A is provided outside of the NC device 100A. The NC device 100A has a configuration where the simulation unit 110 in the NC device 100 illustrated in FIG. 1 is excluded.

The NC device 100A and the simulator 110A can be connected via a network. The network is, for example, a local area network (LAN) constructed in a factory, the Internet, a public telephone network, or a combination thereof. The network communication method is not particularly limited. Whether wired connections or wireless connections are used is not particularly limited, for example.

The NC device 100A may be included in the machine 400. The servo motor 300 may also be included in the machine 400. The configuration of the simulator 110A is identical to the configuration of the simulation unit 110. One or more of the components of the simulator 110A may be disposed on the NC device 100A. For example, the simulation data memory unit 111 may be disposed on the NC device 100A. An information processor such as a personal computer (PC) or a server can constitute the simulator 110A.

The simulator, the numerical control device, and the simulation method according to the present disclosure can take, including to the foregoing embodiment, various types and kinds of embodiments having configurations described below.

(1) A first aspect of the present disclosure is a simulator including:

a memory unit that stores machining position data to be used when a machine tool machines a machining-target object;

a machining surface simulation unit that uses the machining position data that is stored to perform a simulation of a machining surface;

a surface texture calculation unit that calculates a surface texture of the machining surface that is simulated through the simulation of the machining surface; and a machining surface evaluation unit that evaluates the surface texture on the basis of an evaluation condition. The simulator allows quantitative evaluation of whether there is a problem on a machining surface, making it possible to prevent the user from making a different determination. It is also possible to determine numerically whether the machining satisfies the required accuracy.

(2) The simulator according to (1) described above, in which the surface texture calculation unit divides the machining surface that is simulated into a plurality of portions, and calculates a surface texture for each of the divided portions.

(3) The simulator according to (2) described above, in which the machining surface evaluation unit evaluates the surface texture for each of the divided portions on the basis of the evaluation condition, and a display method determination unit that determines a display method for the machining surface on the basis of the result of the evaluation is included. The simulator allows prevention of a failure to find a problematic location due to the skill of the user performing a simulation of a machining surface (for example, how light is applied, and display settings including the line of sight angle).

(4) The simulator according to any one of (1) to (3) described above, in which a origin determination unit that determines an origin that determines an area of the simulation of the machining surface on the basis of the machining position data for a workpiece coordinate system is further included. With the simulator, it is possible to adjust automatically the origin for determining an area for which a machining surface simulation is to be performed.

(5) The simulator according to any one of (1) to (4) described above, in which a shape simulation unit that uses the machining position data that is stored to perform a simulation of the shape of the machining-target object is further included, and the machining surface simulation unit performs the simulation of the machining surface, for a specified location on the machining surface of the machining-target object, the specified location being specified on the basis of the shape of the machining-target object, the shape being acquired by the shape simulation unit.

(6) The simulator according to any one of (1) to (5) described above, in which the machining position data represents one of a machining program, a control command that causes servo control of a servo motor that drives the machine tool, and feedback information from the servo motor and the machine tool.

(7) A second aspect of the present disclosure is a numerical control device including:

the simulator according to (6) described above; and a control unit that generates a control command that causes servo control of the servo motor on the basis of the machining program.

(8) A third aspect of the present disclosure is a simulation method comprising:

storing machining position data to be used when a machine tool machines a machining-target object;

using the machining position data that is stored to perform a simulation of a machining surface; calculating a surface texture of the machining surface that is simulated through the simulation of the machining surface; and evaluating the surface texture on the basis of an evaluation condition. The simulation method allows quantitative evaluation of whether there is a problem on a machining surface, making it possible to prevent the user from making a different determination. It is also possible to determine numerically whether the machining satisfies the required accuracy.

EXPLANATION OF REFERENCE NUMERALS 10, 10A NC machine system
100, 100A NC device
110 Simulation unit
110A Simulator
111 Simulation data memory unit
112 Simulation start command unit
113 Origin determination unit
114 Shape simulation unit
115 Shape simulation display unit
116 Machining surface specification unit
117 Machining surface simulation unit
118 Surface texture calculation unit
119 Evaluation condition specification unit
120 Machining surface evaluation unit
121 Display method determination unit
122 Machining surface display specification unit
123 Machining surface simulation display unit
124 Shape display specification unit
200 Servo control unit
300 Servo motor
400 Machine

What is claimed is:

1. A matching simulator apparatus for quantitatively visualizing a machining surface comprising:

a user interface configured to receive a simulation start request for a selected area of a machining surface of a machining-target object;

a non-transitory memory configured to store one or more programs and machining position data to be used when a machine tool machines the machining-target object; and a hardware controller configured to execute the one or more programs to:

read the machining position data that is stored to perform a machining simulation of the selected area of the machining surface;

divide the selected area of the machining surface that is simulated into a plurality of portions;

calculate a surface texture parameter value for each of the portions of the selected area of the machining surface;

evaluate the surface texture parameter value of each of the portions of the selected area of the machining surface on a basis of an evaluation condition, the evaluation condition being whether the surface texture parameter value of each of the portions of the selected area of the machining surface exceeds a threshold value;

determine a display method for displaying on a screen a result of the evaluation of the surface texture parameter value of each of the portions of the selected area of the machining surface; and display on the screen of the user interface the result of the evaluation of the surface texture parameter value of each of the portions of the selected area of the machining surface on the basis of the determined display method, wherein the determined display method for portions of the selected area of the machining surface with surface texture parameter value that exceeds the threshold value is different from portions of the selected area of the machining surface with surface texture parameter value that do not exceed the threshold value.

2. The machining simulator apparatus according to claim 1, wherein the hardware controller is further configured to determine an origin that determines the selected area of the machining simulation of the machining surface on a basis of the machining position data for a workpiece coordinate system.

3. The machining simulator apparatus according to claim 1, wherein the hardware controller is further configured to use the machining position data that is stored to perform a simulation of a shape of the machining-target object,
wherein the machining surface simulation performs the simulation of the machining surface for a specified location on the machining surface of the machining-target object, the specified location being specified on a basis of the shape of the machining-target object acquired by the shape simulation.

4. The machining simulator apparatus according to claim 1, wherein the machining position data represents one of a machining program, a control command that causes servo control of a servo motor that drives the machine tool, and feedback information from the servo motor and the machine tool.

5. A numerical control device comprising:
the machining simulator apparatus according to claim 4; and
a servo controller configured to generate a control command that controls servo control of the servo motor on a basis of the machining program.

6. A machining simulation method for quantitatively visualizing a machining surface comprising:
storing machining position data to be used when the machine tool machines a machining-target object;
receiving from a user interface a simulation start request for a selected area of a machining surface of the machining-target object;
reading the machining position data that is stored to perform a machining simulation of the selected area of the machining surface;
dividing the selected area of the machining surface that is simulated into a plurality of portions;
calculating a surface texture parameter value for each of the portions of the selected area of the machining surface that is simulated through the machine simulation;
evaluating the surface texture parameter value of each of the portions of the selected area of the machining surface on a basis of an evaluation condition, the evaluation condition being whether the surface texture parameter value of each of the portions of the selected area of the machining surface exceeds a threshold value;
determining a display method for displaying on a screen a result of the evaluation of the surface texture parameter value of each of the portions of the selected area of the machining surface; and
displaying on the screen of the user interface the result of the evaluation of the surface texture parameter value of each of the portions of the selected area of the machining surface on the basis of the determined display method,
wherein the determined displaying method for portions of the selected area of the machining surface with surface texture parameter value that exceeds the threshold value is different from portions of the selected area of the machining surface with surface texture parameter value that do not exceed the threshold value.

* * * * *